(12) United States Patent
Jayaraman

(10) Patent No.: US 6,974,966 B1
(45) Date of Patent: Dec. 13, 2005

(54) MULTIPLE EPITAXIAL REGION WAFERS WITH OPTICAL CONNECTIVITY

(75) Inventor: Vijaysekhar Jayaraman, 270 Coronado Dr., Goleta, CA (US) 93117

(73) Assignee: Vijaysekhar Jayaraman, Santa Barbara, CA (US)

( * ) Notice: Subject to any disclaimer, the term of this patent is extended or adjusted under 35 U.S.C. 154(b) by 0 days.

(21) Appl. No.: 10/342,734

(22) Filed: Jan. 15, 2003

Related U.S. Application Data

(60) Provisional application No. 60/349,543, filed on Jan. 16, 2002.

(51) Int. Cl.[7] ............................................. H01L 29/06
(52) U.S. Cl. ......................................... 257/14; 438/22
(58) Field of Search ............................ 257/14, E23.02, 257/E21.088, E21.122, E21.48, E21.519; 438/22

(56) References Cited

U.S. PATENT DOCUMENTS

| | | | | |
|---|---|---|---|---|
| 3,636,618 A | * | 1/1972 | Herzog et al. | 438/121 |
| 4,979,002 A | * | 12/1990 | Pankove | 257/85 |
| 5,840,616 A | * | 11/1998 | Sakaguchi et al. | 438/459 |
| 6,339,603 B1 | * | 1/2002 | Flanders et al. | 372/20 |
| 6,459,716 B1 | | 10/2002 | Lo | 372/50 |
| 2003/0013218 A1 | * | 1/2003 | Chason | 438/27 |
| 2003/0081878 A1 | * | 5/2003 | Joyner et al. | 385/14 |

OTHER PUBLICATIONS http://www.photonics.com/dictionary Definition of the word "Kovar".*
Heterogeneous Opto-Electronic Integration 2000 Ed. Towe, E Author: Fonstad, C Ch—1 pp. 3-47.
Vertical & Lateral Heterogeneous Integration 2001 Author: Geske, et al pp. 1760-1762 Apl vol. 79, No. 12.
Wafer Fused Vertical Cavity Lasers 1994 Author: Dudley Chs. 3 & 4 pp. 53-105.

* cited by examiner

*Primary Examiner*—Nathan J. Flynn
*Assistant Examiner*—Scott R Wilson

(57) ABSTRACT

A semiconductor wafer according to the present invention has multiple epitaxial regions comprising planar epitaxial surfaces and edge surfaces, where the planar epitaxial surfaces are wafer bonded at different lateral positions to a host substrate, and an edge surface of each epitaxial region is bonded to an edge surface of an adjacent epitaxial region. This enables the fabrication of photonic integrated circuits that traverse the different regions, providing previously unattainable functionality, performance, or level of integration. The method of achieving this includes placing sections cleaved from various source wafers onto a single common host substrate, and applying a combination of vertical and lateral pressure to achieve bonding of both planar surfaces and edge surfaces.

22 Claims, 18 Drawing Sheets

MULTIPLE EPITAXIAL REGION WAFERS WITH OPTICAL CONNECTIVITY

CROSS-REFERENCES TO RELATED APPLICATIONS

This application is entitled to the benefit of Provisional Patent Application Ser. No. 60/349,543, filed 2002, Jan. 16.

BACKGROUND

1. Field of the Invention

This invention relates generally to wafer bonding, materials integration, and heterogeneous integration.

2. Description of Prior Art

Wafer bonding refers to the use of pressure, heat, and in some cases interfacial adhesive layers to combine dissimilar materials in one monolithic semiconductor structure. Most wafer bonding involves the integration of two dissimilar substrates, such as Gallium Arsenide (GaAs) and Indium Phosphide (InP) in the vertical direction [J. Dudley, "Wafer Fused Vertical Cavity Lasers," Ph.D. Dissertation University of California, chapter 4, 1994.]. FIG. 1 illustrates this prior art, where an InP substrate 30 with a grown epitaxial region 33 is bonded to a GaAs substrate 31 with a grown epitaxial region 34, at a wafer bonded interface 32. After removal of either the GaAs substrate 31 or the InP substrate 30 in FIG. 1, the combined epitaxial structure rests on one substrate. The technique of FIG. 1 enables integration of dissimilar materials in the vertical direction only, and not in the lateral direction.

A number of techniques have been demonstrated to integrate dissimilar materials in the lateral direction. These fall into two categories: epitaxial growth techniques (FIGS. 4–5) and wafer bonding techniques (FIGS. 2–3). FIGS. 4A–C illustrate the technique of epitaxial regrowth. Referring to FIG. 4A, a first epitaxial region 71 is grown on a substrate 70. The region 71 is etched away over a portion of the wafer 70, as shown in FIG. 4B. Finally, FIG. 4C shows a region 72 re-grown in the etched region, creating regions 71 and 72 adjacent to each other on the common substrate 70. The technique of FIGS. 4A–C is limited because the regrown region 72 must have the same lattice structure as the substrate 70 and the first epitaxial region 71. In addition, the regrown material 72 is of inferior optical quality relative to the as-grown material 71. For this reason, regrown material is generally optically passive or incapable of producing optical gain. Even optically passive regions, such as tuning regions in a tunable laser, suffer from non-radiative charge re-combination at regrown interfaces, leading to reduced tuning efficiency.

FIG. 5 illustrates another prior art epitaxial growth technique referred to as selective area growth. In this technique, a semiconductor wafer 80 is coated with a patterned silicon dioxide coating 81. Epitaxial material only nucleates or grows where the silicon dioxide is etched away, resulting in an epitaxial layer 82. FIG. 6 illustrates that the epitaxial layer 82 grows fastest where the silicon dioxide window is narrowest. Using a variable width window allows the growth rate at different parts of the wafer to be different. This technique can be used to fabricate semiconductor quantum wells of differing thickness and differing resultant emission wavelengths, but cannot be used to create large composition variation across a wafer.

FIGS. 2–3 illustrate prior art wafer bonding approaches to achieving epitaxial variation in the lateral direction. FIG. 2 illustrates the technique of aligned wafer bonding [Elias Towe, ed. "Heterogeneous Opto-Electronic Integration," SPIE Press, 2000, Bellingham, Wash., Chapter 1.], where a first substrate 51 with a partially etched first epitaxial structure 52 is bonded to a second substrate 50 with a second epitaxial structure 53 that has been etched in a fashion complementary to the etch of epitaxial structure 52. This technique allows integration of largely dissimilar regions, but is limited to 2 regions, and there remains a gap 54 that is at least 1–2 microns wide (established by the alignment precision of the aligned bonding technique) between the two regions in the final structure. This eliminates the possibility of low-loss optical connectivity between the regions.

FIGS. 3A–C show a technique using non-planar wafer bonding [J. Geske, Y. L. Okono, J. E. Bowers, and V. Jayaraman, "Vertical and Lateral Heterogeneous Integration," *Applied Physics Letters*, vol. 79, no. 12, pp. 1760–1762]. Referring to FIG. 3A, first, second and third epitaxial regions 61,62, and 63 respectively are grown vertically adjacent on a source substrate 60. Each of the regions 61–63 is partially etched to reveal the surfaces of all regions. The regions are then butted against a host substrate 64, as shown in FIG. 3B. The source substrate 60 and epitaxial regions 61–63 deform to make contact with the host substrate 64. FIG. 3C shows the structure that remains after the source substrate 60 and portions of the regions 61–63 have been etched away. What remains is the 3 epitaxial regions 61,62 and 63 integrated side by side on the host substrate 64, with gaps between them where deformation regions have been etched away. In this way, vertical integration is converted to lateral integration. Although this technique enables the integration of a large number of epitaxial regions, the necessity of gaps between the regions eliminates the possibility of low-loss optical connectivity between them. In addition, because the regions are integrated vertically prior to bonding, they must all be of the same lattice structure and dimension. Furthermore, strain limits on the combined vertical structure limit the allowable strain per epitaxial region, and deformation limits on the source wafer limit the thickness of each epitaxial region.

In summary, prior art epitaxial growth techniques of lateral integration require lattice compatibility between the regions, lead to compromised optical quality in the case of re-growth, and enable only lateral thickness variation in the case of selective growth. Prior art wafer bonding techniques suffer from one or more of the following problems: a small number of allowable lateral regions, constraints on region composition and thickness, and gaps which eliminate the possibility of low loss optical connectivity between regions.

From the foregoing, it is clear that what is required is an integration technique that allows the lateral integration of a large number of epitaxial regions with excellent optical quality of each region, low-loss optical connectivity between regions, and a minimum of constraints on the composition of each region.

SUMMARY OF THE INVENTION

The present invention provides an epitaxial structure that is assembled from several source wafer sections and one host wafer. Each source wafer section is wafer bonded to the host substrate beneath it. In addition, an edge surface of each source wafer section is bonded to an edge surface of the source wafer section next to it. This latter edge surface to edge surface bond can be a strong semiconductor to semiconductor bond, or it can be a mechanically weak bond which occurs simply when two surfaces come in contact. An interfacial dielectric layer may be present in the case of a weak bond. The horizontal bond interface to the host substrate provides the bulk of the mechanical robustness, and the bond between adjacent source wafer section edges provides low-loss optical connectivity between regions. Because each epitaxial region originates from a different source wafer, the various epitaxial regions can vary widely from each other in composition and function.

In the preferred embodiment of this invention, a final wafer is assembled in the following way. First, sections of source wafer are cleaved from each of the respective source wafers. The cleaved edges have atomic smoothness and facilitate edge to edge semiconductor to semiconductor bonds. A first section is then placed on a top surface of a host wafer, and pressed against a stop in the lateral direction, where it is temporarily clipped into place. A second section is then placed next to the first, pushed against one edge of the first, and also clipped into place. In this way, all of the source wafer sections are placed with lateral pressure pushing the sections together along their edges. After all the sections have been placed, pressure is applied from the vertical direction in addition to that present in the lateral direction. The temporary clips are then removed, and small increases to vertical and lateral pressure are made. The assembly is then heated to temperatures in the range of 300° C. to 800° C., depending on the materials being bonded. Thermal expansion combined with lateral constraints adds to the applied pressure. After bonding, the source substrates are removed. If all the source substrates are the same material, this can be accomplished in one etch step; if there are 2 materials, then two etch steps, and so on.

The final structure can be processed into a variety of novel structures which would be impossible by other lateral integration techniques. One such structure is a laser with compressively strained quantum wells over a portion of the optical cavity, and tensilely strained wells over the remainder of the cavity, with independent contacts to the two sections. This enables new polarization switching devices for very high speed, high extinction ratio modulation. We define the strain of the quantum well as compressive if the lattice constant of the quantum well material in bulk form is larger than that of the substrate on which the quantum well is grown. The opposite is true for tensilely strained wells.

In another exemplary structure a pump laser pumping a signal laser can be integrated on one substrate in an axial pumping or edge pumping configuration. Another exemplary structure involves a laser integrated next to an electro-absorption modulator. By using the freedom in composition of these two regions that the present invention provides, this modulator can have superior chirp, extinction, and insertion loss characteristics. Another exemplary structure provides a tunable laser in which an active region is integrated next to a passive tuning region.

In another exemplary structure two or more lasers or detectors at different wavelengths are placed in an in-line geometry. This enables combining or separating multiple wavelengths in an optical fiber without the use of an expensive wavelength division multiplexer or demultiplexer. Different wavelength active regions and different period gratings can be combined in one substrate by means of the invention described herein.

A further understanding of the nature and advantages of the present invention may be realized by reference to the remaining portions of the specifications and drawings.

REFERENCE NUMERALS IN DRAWINGS

Figure 1:
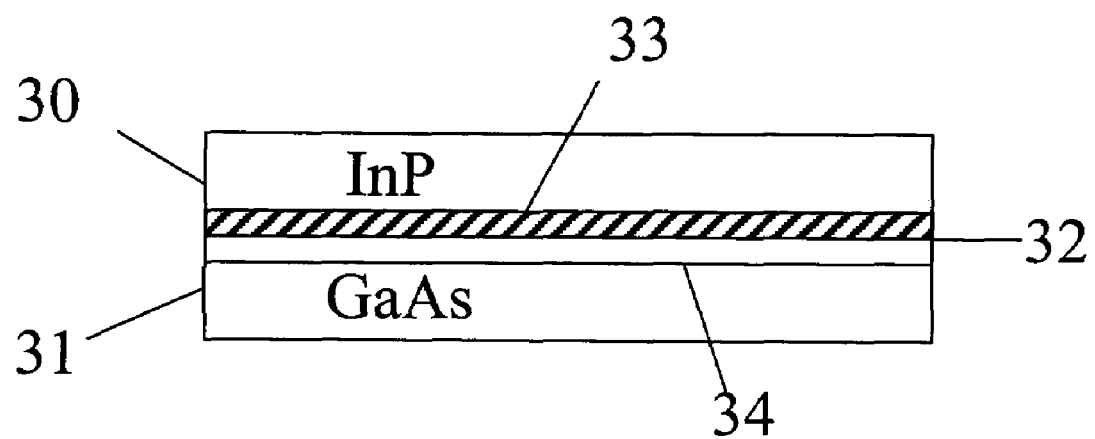
FIG. 1 is a schematic representation of a prior art wafer bonding technique that enables vertical integration of two dissimilar epitaxial regions.
Figure 2:
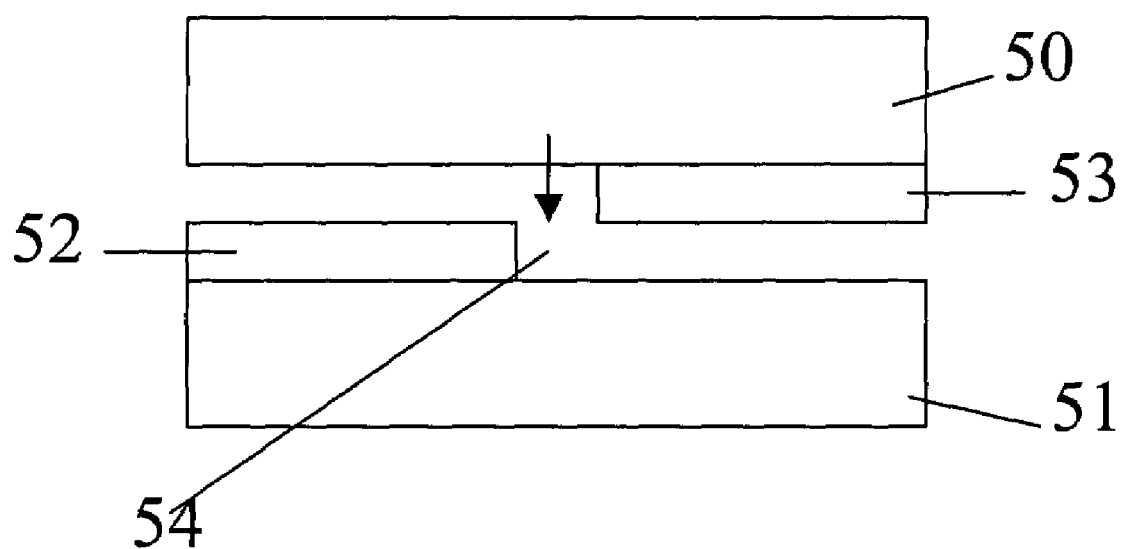
FIG. 2 is a schematic representation of a prior art aligned wafer bonding technique that enables lateral integration of two dissimilar epitaxial regions with a gap between them.
Figure 3A:
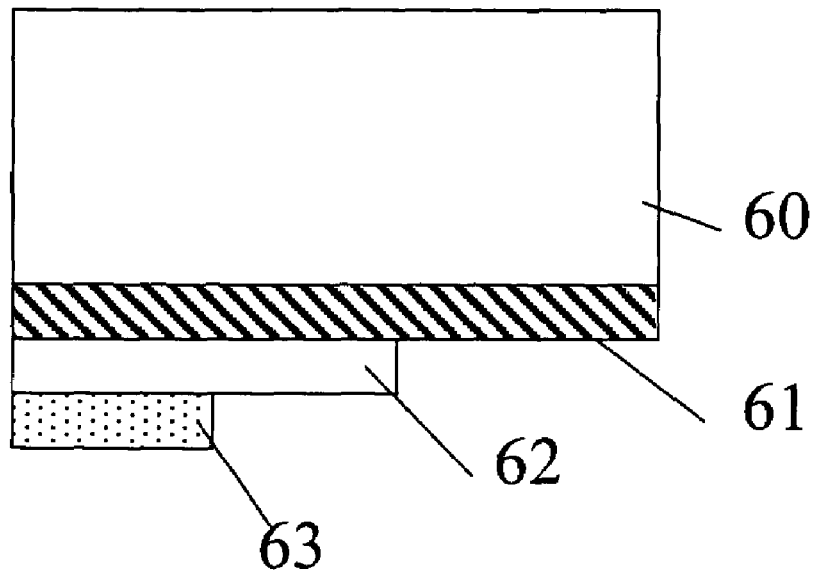
FIG. 3A is a schematic representation of a first step in a prior art non-planar bonding technque, where a carrier substrate has 3 epitaxial regions integrated vertically, with etching to reveal each region at a different lateral location.
Figure 3B:
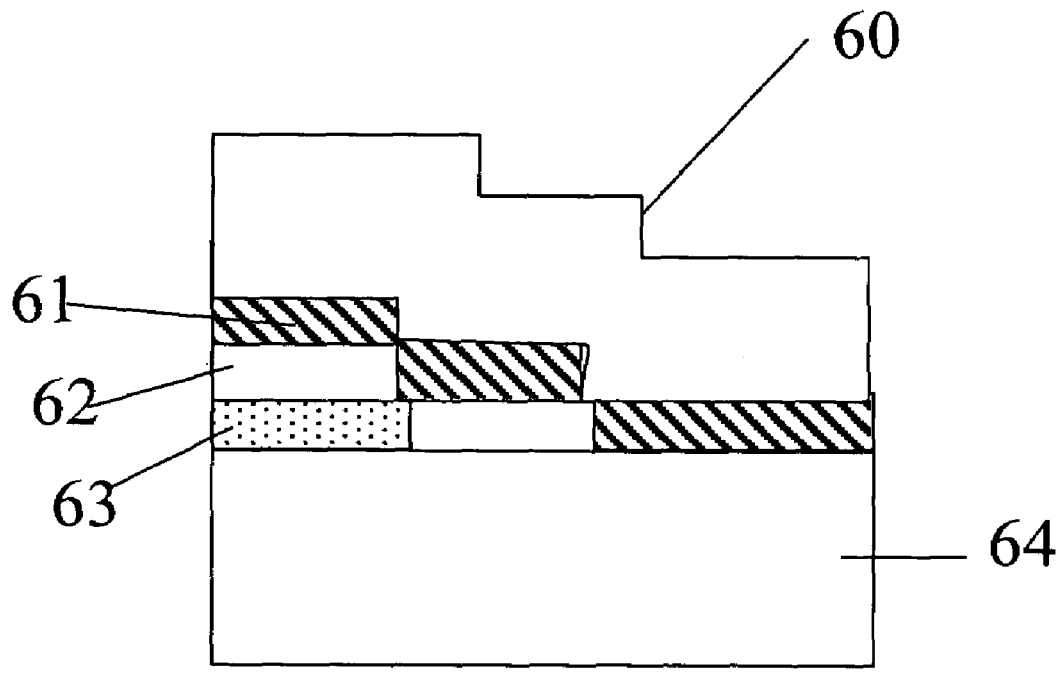
FIG. 3B is a schematic representation of a second step in a prior art non-planar bonding technique, where the structure of FIG. 3A being pressed against a host wafer.
Figure 3C:
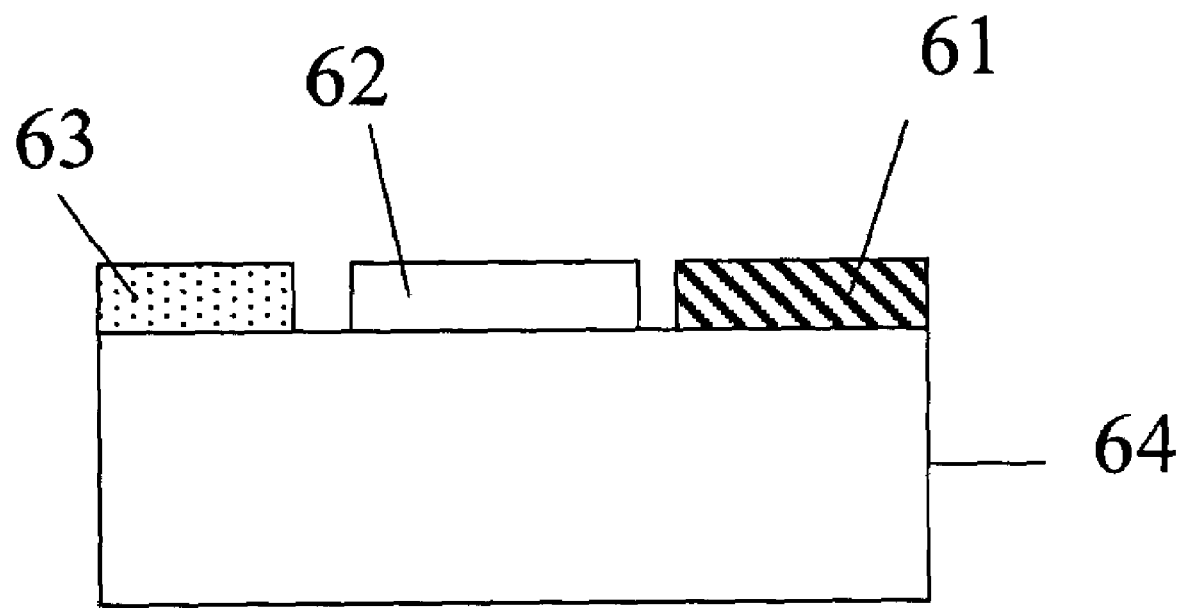
FIG. 3C is a schematic representation of a $3^{rd}$ step in a prior art non-planar bonding technique, where the carrier substrate of FIG. 3B is etched away along with excess epitaxy, leaving 3 laterally integrated epitaxial regions with gaps.
Figure 4A:
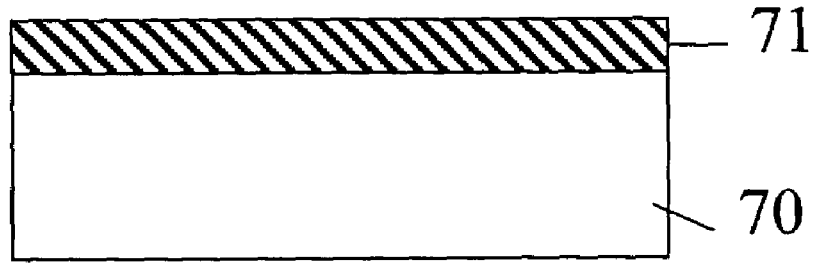
FIG. 4A is a schematic representation of a first step in a prior art epitaxial regrowth technique, where a first epitaxial region is grown on a substrate.
Figure 4B:
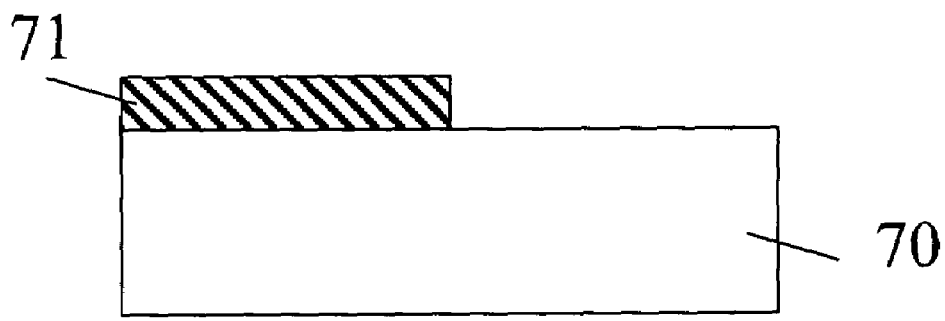
FIG. 4B is a schematic representation of a $2^{nd}$ step in a prior art epitaxial regrowth technique, where a first epitaxial region is etched away in portions of a wafer.
Figure 4C:
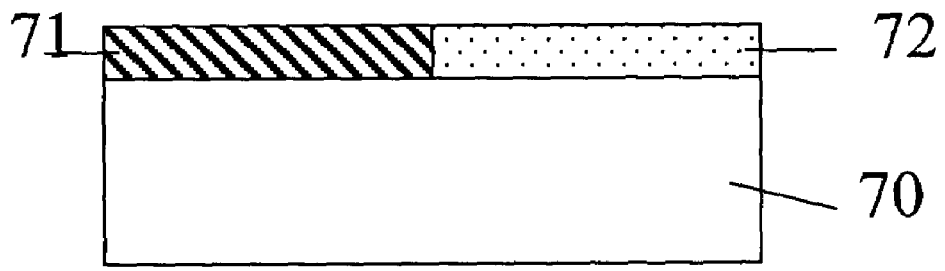
FIG. 4C is a schematic representation of a $3^{rd}$ step in a prior art epitaxial growth technique, where a second epitaxial region is re-grown where a first epitaxial region has been etched away.
Figure 5:
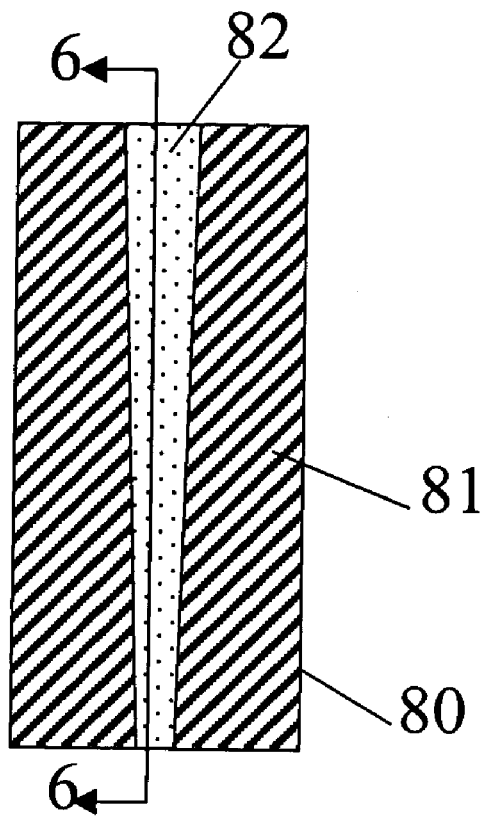
FIG. 5 is a top view schematic representation of a prior art selective-area epitaxial growth technique enabling lateral thickness variation across a wafer.
Figure 6:
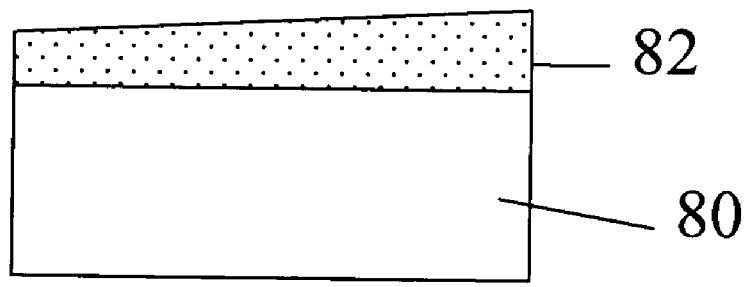
FIG. 6 is a schematic cross-sectional view of the prior art selective-area epitaxial growth technique in FIG. 5, illustrating the nature of the achieved thickness variation.

30 Indium Phosphide (InP) substrate in prior art wafer bonding of two wafers
31 Gallium Arsenide (GaAs) substrate in prior art wafer bonding of two wafers
32 Horizontal wafer bonded interface in prior art wafer bonding of two wafers
33 Epitaxial region grown on InP in prior art wafer bonding.
34 Epitaxial region grown on GaAs in prior art wafer bonding.
50 Second substrate in prior art aligned wafer bonding technique.
51 First substrate in prior art aligned wafer bonding technique.
52 First epitaxial region in prior art aligned wafer bonding technique.
53 Second epitaxial region in prior art aligned wafer bonding technique.
54 Gap between epitaxial regions in prior art aligned wafer bonding technique.
60 Carrier substrate in prior art non-planar bonding technique.
61 First epitaxial region in prior art non-planar bonding technique.
62 Second epitaxial region in prior art non-planar bonding technique.
63 Third epitaxial region in prior art non-planar bonding technique.
64 Host substrate in prior art non-planar bonding technique.
70 Substrate in prior art regrowth technique.
71 As-grown epitaxial region in prior art regrowth technique.
72 Regrown region in prior art regrowth technique.
80 Substrate in prior art selective area growth technique.
81 Silicon dioxide coating in prior art selective area growth technique.
82 Tapered thickness epilayer in prior art selective area growth technique.
90 Vertical wafer bonded interface in present invention.
91 Host substrate in present invention.
92 First epitaxial region in present invention.
93 Second epitaxial region in present invention.
94 Horizontal wafer bonded interface in present invention.
97 Top surface of host substrate in present invention.
100 First vertical wafer bonded interface in 2-step application of present invention.
101 Host substrate in 2-step application of present invention.
102 First epitaxial region in 2-step application of present invention.
103 Second epitaxial region in 2-step application of present invention.
104 Third epitaxial region in 2-step application of present invention.
105 Fourth epitaxial region in 2-step application of present invention.
106 Second vertical wafer bonded interface in 2-step application of present invention.
120 Host substrate in preferred method of making present invention.
123 First edge of source wafer section array in preferred method of making present invention.
124 Second edge of source wafer section array in preferred method of making present invention.
125 First pressure block in preferred method of making present invention.
126 Second pressure block in preferred method of making present invention.
127 Third pressure block in preferred method of making present invention.
128 Fourth pressure block in preferred method of making present invention.
129 Force vector applied by first pressure block.
130 Force vector applied by second pressure block.
132 Force vector applied by third pressure block.
132 Force vector applied by fourth pressure block.
140 First source wafer section in preferred method of making present invention.
140A Substrate surface of first source wafer section in preferred method of making present invention.
140B Epitaxial surface of first source wafer section in preferred method of making present invention.
140C Epitaxial region associated with first source wafer section.
143 Vertical wafer bonded interface in preferred method of making present invention.
144 Second source wafer section in preferred method of making present invention.
144A Substrate surface of second source wafer section in preferred method of making present invention.
144B Epitaxial surface of second source wafer section in preferred method of making present invention.
144C Epitaxial region associated with second source wafer section.
145 First planar surface of host substrate in preferred method of making present invention.
146 Second planar surface of host substrate in preferred method of making present invention.
148 Source wafer section array in preferred method of making present invention.
150A,B Retaining clips on first source wafer section during preferred assembly.
151A,B Retaining clips on second source wafer section during preferred assembly.
154 Force vector applied to source wafer sections during preferred assembly.
156 First step in preferred method of making present invention.

158 Second step in preferred method of making present invention.
160 Third step in preferred method of making present invention.
162 Fourth step in preferred method of making present invention.
164 Fifth step in preferred method of making present invention.
166 Sixth step in preferred method of making present invention.
168 Seventh step in preferred method of making present invention.
169 Eighth step in preferred method of making present invention.
170 Horizontal wafer bonded interface in laser/modulator according to present invention.
171 Host Substrate in tunable laser according to present invention.
172 Emitted beam from tunable laser according to present invention.
173 Laser region in tunable laser according to present invention.
174 Passive tuning region in tunable laser according to present invention.
175 Vertical wafer bonded interface in tunable laser according to present invention.
178 Tunable laser according to present invention.
180 Horizontal wafer bonded interface in laser/modulator according to present invention.
181 Host Substrate in laser/modulator according to present invention.
182 Emitted beam from laser/modulator according to present invention.
183 Modulator region in laser/modulator according to present invention.
184 Laser region in laser/modulator according to present invention.
185 Vertical wafer bonded interface in laser/modulator according to present invention.
186 Laser integrated with modulator according to present invention.
190 Horizontal wafer bonded interface in polarization switching laser according to present invention.
191 Host substrate in polarization switching laser according to present invention.
192 Emitted beam from polarization switching laser according to present invention.
193 Tensilely strained quantum wells in polarization switching laser.
194 Compressively strained quantum wells in polarization switching laser.
195 Vertical wafer bonded interface in polarization switching laser.
196 Electrode for injecting charge into compressively strained wells of polarization switching laser.
197 Electrode for injecting charge into tensilely strained wells of polarization switching laser.
198 Polarizer for selecting one polarization of polarization switching laser.
199 Optical fiber for receiving light emitted from polarization switching laser.
200 Polarization switching laser according to present invention.
220 Host substrate in shared cavity optically pumped laser.
221 Horizontal wafer bonded interface in shared cavity optically pumped laser.
222 Pump region of shared cavity optically pumped laser.
223 Signal region of shared cavity optically pumped laser.
224 Vertical wafer bonded interface of shared cavity optically pumped laser.
225 Emitted beam from shared cavity optically pumped laser.
226 First dielectric mirror in shared cavity optically pumped laser.
227 Second dielectric mirror in shared cavity optically pumped laser.
228 Optical axis in shared cavity optically pumped laser.
230 Shared cavity optically pumped laser according to present invention.
240 Host substrate in separated cavity optically pumped laser.
241 Horizontal wafer bonded interface in separated cavity optically pumped laser.
242 Pump region in separated cavity optically pumped laser.
243 Signal region of separated cavity optically pumped laser.
244 Vertical wafer bonded interface in separated cavity optically pumped laser.
245 Emitted beam from separated cavity optically pumped laser.
246 Dielectric mirror in separated cavity optically pumped laser.
247 Optical axis in separated cavity optically pumped laser.
250 Separated cavity optically pumped laser according to present invention.
260 Signal laser in edge-pumped optically pumped laser.
261 Optical axis of pump laser in optically pumped laser.
262 Optical axis of signal laser in edge-pumped optically pumped laser.
263 Vertical wafer bonded interface in edge-pumped optically pumped laser.
270 Edge-pumped optically pumped laser according to present invention.
280 1550 active region of in-line WDM transmitter.
281 1550 DBR of in-line WDM transmitter.
282 1310 DBR of in-line WDM transmitter.
283 1310 active region of in-line WDM transmitter.
284 First dielectric mirror of in-line WDM transmitter.
285 Second dielectric mirror of in-line WDM transmitter.
286 Host substrate of in-line WDM transmitter.
287 Horizontal wafer bonded interface of in-line WDM transmitter.
288 First vertical wafer bonded interface of in-line WDM transmitter.
289 Second vertical wafer bonded interface of in-line WDM transmitter.
290 Third vertical wafer bonded interface of in-line WDM transmitter.
291 Emitted beam from in-line WDM transmitter.
300 In-line WDM transmitter according to present invention.
310 1550 absorber of in-line WDM receiver.
311 1310 absorber of in-line WDM receiver.
312 Incoming beam of in-line WDM receiver.
313 Host substrate of in-line WDM receiver.
314 Horizontal wafer bonded interface of in-line WDM receiver.
315 Vertical wafer bonded interface of in-line WDM receiver.
320 In-line WDM receiver according to present invention.

DETAILED DESCRIPTION OF THE PREFERRED EMBODIMENTS

Figure 7:
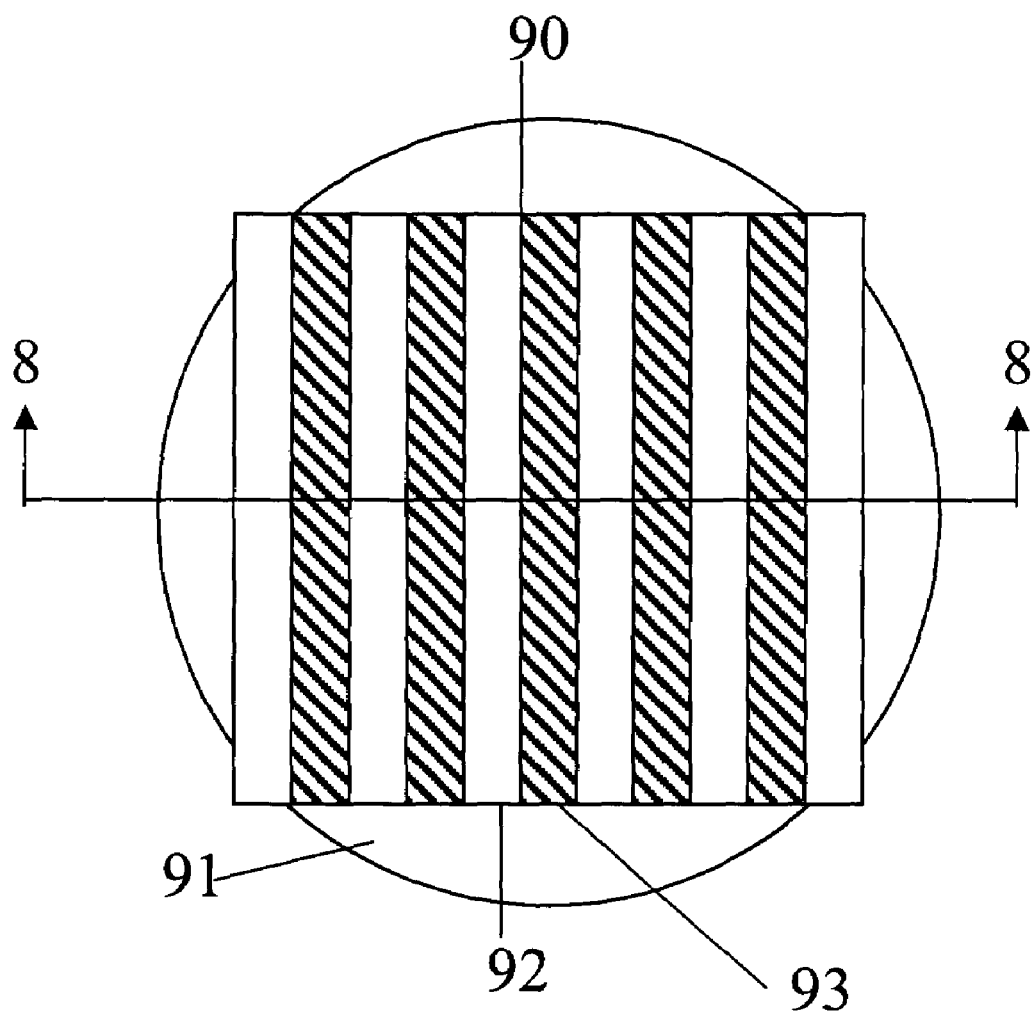
FIG. 7 is a top-view schematic representation of a preferred generic embodiment of the present invention.
Figure 8:
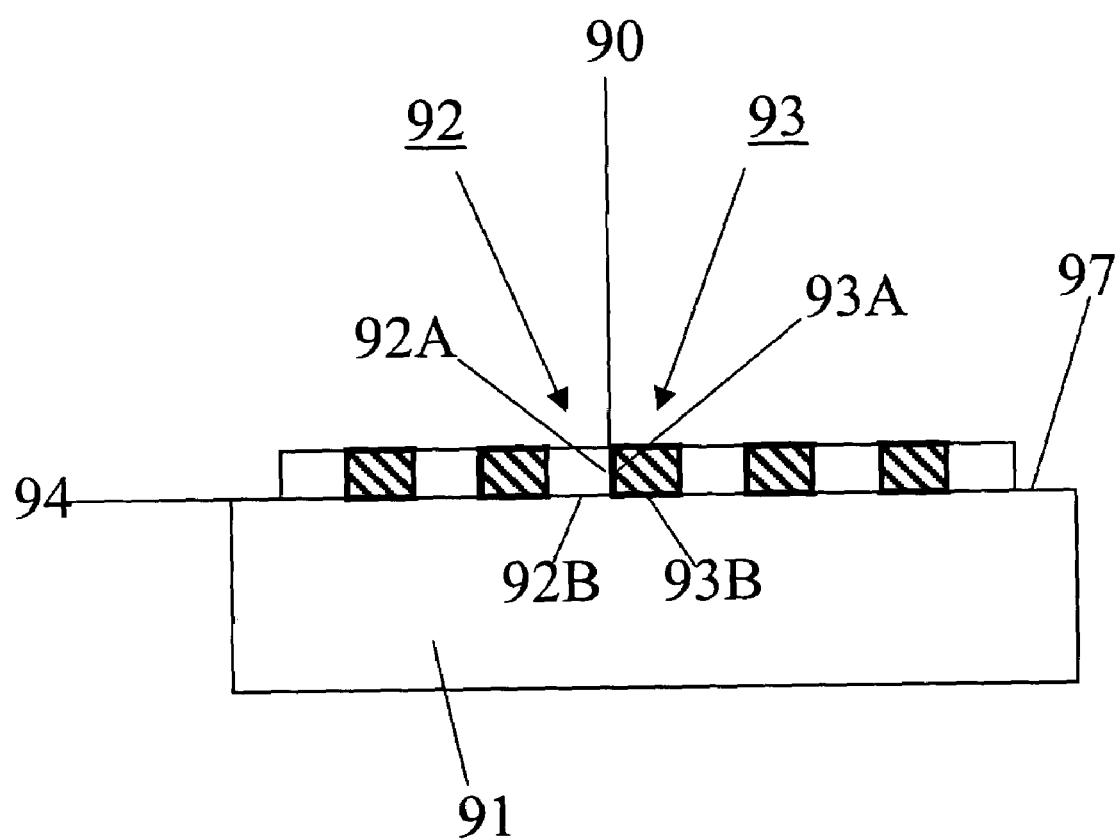
FIG. 8 is a cross-sectional schematic representation of a preferred generic embodiment of the present invention.

FIGS. 7 and 8 are top and cross-sectional views, respectively, of a preferred generic embodiment of a multiple epitaxial region substrate in accordance with the present invention. FIG. 7 shows a host substrate 91 underneath alternating first and second epitaxial regions 92 and 93. An edge of region 92 is bonded laterally to an edge of region 93, creating a vertical wafer bonded interface 90 in accordance with the present invention. Although the configuration of FIG. 7 only shows two epitaxial regions repeated across the wafer, this is only intended to be illustrative and not limiting. The present invention can be extended to any number of different epitaxial regions.

Throughout this specification, whenever the term "wafer-bonded interface" is used, it is assumed to comprise the interfacial material if such material is employed, and the chemical bonds at that interface regardless of their nature. Additionally throughout this specification, whenever we refer to a "bond" between surfaces, we implicitly exclude epitaxially grown bonds or bonds occurring in nature. For example, the interface between an epitaxial layer and the substrate on which it is grown is not a "bonded" interface according to our definition. Similarly, bonds between atomic planes in a continuous crystal are not "bonded surfaces" according to our definition.

FIG. 8 shows a cross-sectional view of the structure in FIG. 7, illustrating a horizontal wafer bonded interface 94 between a planar surface 97 of the host substrate 91 and planar surfaces 92B and 93B of first and second epitaxial regions 92 and 93 respectively. The Figure also illustrates the vertical wafer bonded interface 90 which is formed by bonding an edge surface 92A of epitaxial region 92 to an edge surface 93A of epitaxial region 93, in accordance with the present invention. Edge surfaces 92A and 93A are substantially perpendicular to planar surfaces 92B and 93B. Throughout this specification, whenever we refer to a "planar surface," we mean "substantially planar." We include surfaces that may be patterned, but exhibit gross or "envelope" planarity. For example, a wafer with mesas that are 50 microns square, 10 microns high, and separated by 500 microns would still be a planar surface according to our definition, since the "envelope" of mesa tops generally forms a plane.

Although FIGS. 7 and 8 illustrate direct semiconductor to semiconductor bonds, this is only meant to be illustrative and not limiting. The bond interfaces may contain interfacial layers such as sputtered or evaporated dielectrics, or metals. The nature of the bond formed may also vary, from relatively weak VanDerWaals forces, to robust bonding by atomic re-arrangement. In particular, the configuration of the invention enables the vertical wafer bonded interface 90 in FIGS. 7 and 8 to be a mechanically weak or partial bond, because the horizontal bonded interface 94 provides overall mechanical robustness.

Figure 9:
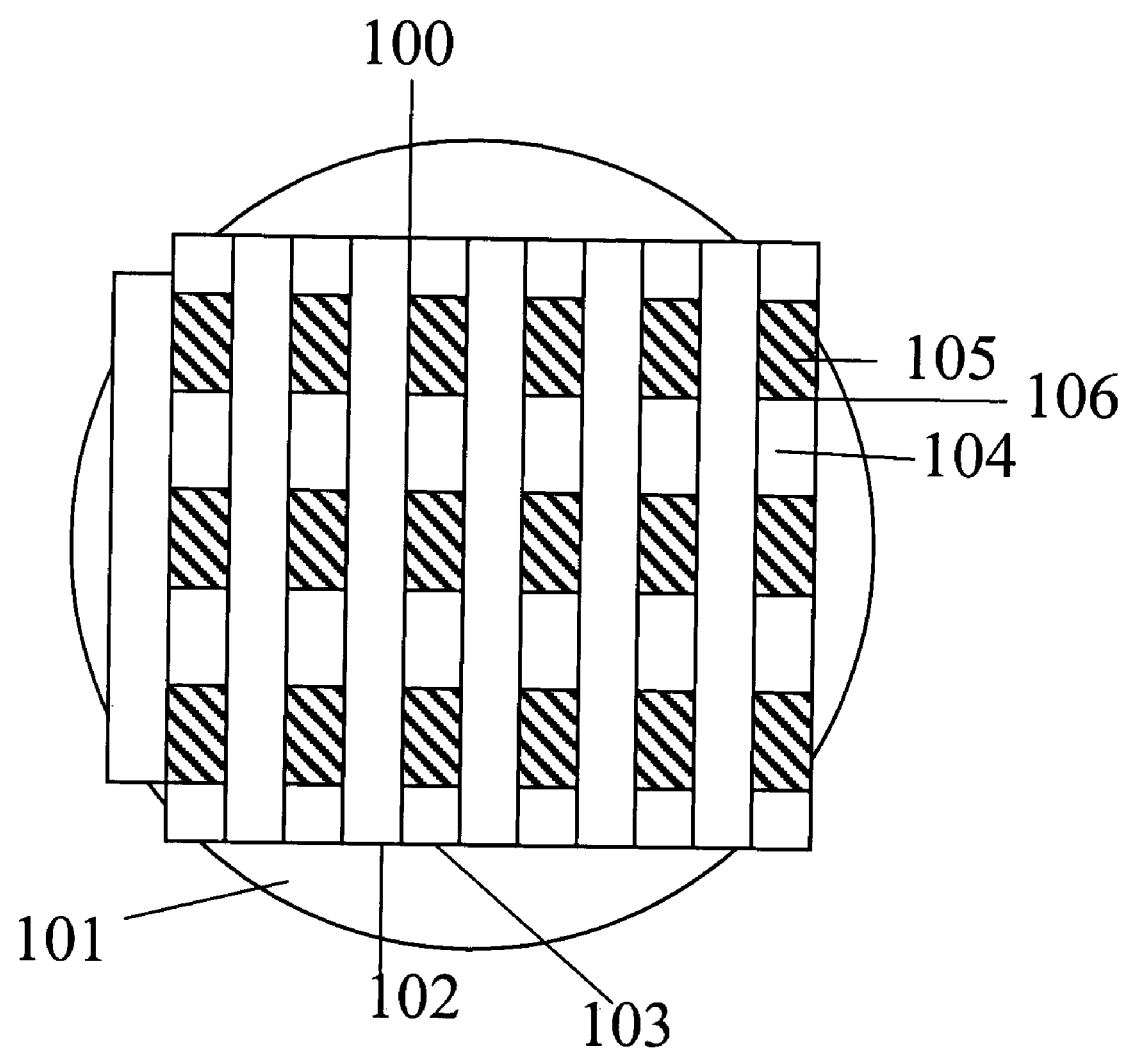
FIG. 9 is a top view schematic representation of the present invention applied twice, enabling lateral integration of dissimilar epitaxial regions in two dimensions.

FIG. 9 shows a top view of a multiple epitaxial region substrate with epitaxial variation in two dimensions, in accordance with the present invention. The 2-dimensional variation is accomplished by applying the present invention twice in succession. A host substrate 101 contains alternating strips of a first epitaxial region 102 and a second epitaxial region 103 separated by a first vertical wafer bonded interface 100. Second epitaxial region 103 is cleaved from another multiple epitaxial region substrate in accordance with the present invention. Thus, region 103 contains within itself a third epitaxial region 104 alternating with a fourth epitaxial region 105 and separated by a second vertical wafer bonded interface 106.

Figure 10:
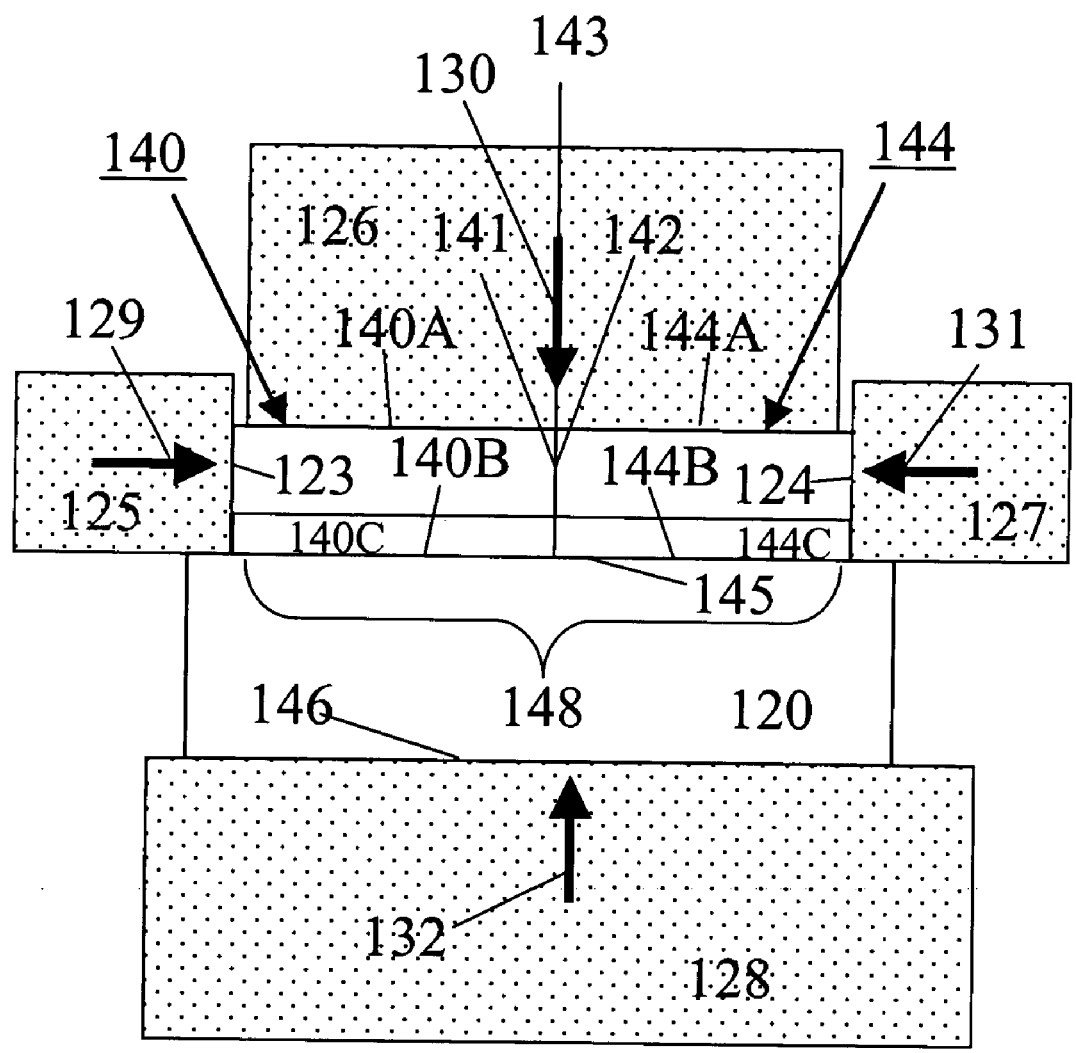
FIG. 10 illustrates schematically the preferred method of manufacturing a multiple epitaxial region substrate according to the present invention.

FIG. 10 illustrates the preferred method for making a multiple epitaxial region substrate in accordance with the present invention. The present case illustrates, by way of example, an array of 2 source wafer sections 148. The technique can be easily applied to a large number of source wafer sections, but the choice of two in the present example simplifies the explanation. The array 148 includes a first source wafer section 140, comprising a substrate surface 140A, an epitaxial surface 140B, and an epitaxial region 140C. First source wafer section 140 lies adjacent a second source wafer section 144, comprising a substrate surface 144A, an epitaxial surface 144B, and an epitaxial region 144C. The epitaxial surfaces 140B and 144B are in contact with a first planar surface 145 of a host substrate 120. The epitaxial surface of a source wafer section refers to the surface of epitaxy grown on the wafer, and the substrate surface refers to that surface on the non-epitaxy side of the wafer. (If both sides of the wafer have epitaxy, we define the epitaxy side as that side which has the epitaxy which we desire to integrate on the host wafer 120.) In the preferred embodiment, an edge 141 of source wafer section 140 and an edge 142 of source wafer section 144 comprise cleaved semiconductor facets with atomic smoothness, which promotes formation of the vertical wafer bonded interface 143. The combination of source wafer sections and host substrate is surrounded by a first pressure block 125, second pressure block 126, third pressure block 127 and fourth pressure block 128. Block 125 exerts a force vector 129 on a first edge 123 of the array 148 pointing towards a second edge of the array 124. Block 126 exerts a force vector 130 on the substrate surfaces 140A and 144A of the source wafer sections 140 and 144, pointing toward the first planar surface 145 of the host wafer 120. Block 127 exerts a force vector 131 on the second edge 124 of the array 148 pointing opposite the force vector 129. Block 128 exerts a force vector 132 on a second planar surface 146 of the host wafer 120, pointing opposite the force vector 130. In conjunction with force vectors 129–132, the entire assembly is heated to a temperature between about 300° C. and about 800° C., depending on the materials used for the epitaxial regions and the host substrate. The bonding is performed in a Nitrogen ambient, preferably after the bonding chamber has been evacuated to <50 mTorr and purged with Nitrogen at least 3 times, to remove residual oxygen. In the preferred embodiment, all source wafer sections and the host wafer are made of Indium Phosphide or materials which can be epitaxially grown on InP, and the bonding temperature is about 550° C. The particular temperatures required for other combinations of materials are described in prior art literature, and are well known to those skilled in the art of wafer bonding. It should be noted here that one or more of the force vectors 129, 130, 131, and 132 may be created by an immovable stop against which the source wafer sections 140 and 144 and host wafer 120 expand when temperature is applied to the assembly. The pressure blocks 125, 126, 127 and 128 are preferably made of graphite, and the forces applied at room temperature by tightening screws (not shown) on a graphite fixture to a known torque, similar to the method described in [D. I. Babic, et al "Double-Fused Long-Wavelength Vertical Cavity Lasers," *PhD Dissertation*, University of California at Santa Barbara, chapter 3, August, 1995.] After cooling the assembly, the substrates associated with the various source wafer sections can be removed by a combination of mechanical lapping and selective chemical etching, leaving only the epitaxial regions 140C and 144C. The number of etch steps used and the composition of etch solutions depends on the exact chemical composition of the substrates associated with the source wafer sections. In the preferred case of an Indium Phosphide substrate, a solution containing approximately 3 parts HCL to 1 part water is used to remove the InP and stop on an Indium Gallium Arsenide Phosphide (InGaAsP) layer. Other etches for other substrates are well known to those skilled in the art.

FIGS. 1A–C illustrate in a top view further details of the preferred method for assembling the host substrate 120 and source wafer sections 140 and 144 of FIG. 10. FIG. 12 describes the steps associated with FIGS. 11A–C in flowchart form. As is familiar to those skilled in the art, all source wafer sections and the host wafer must be stripped of native oxides prior to beginning assembly. This can be accomplished by well-known chemical etches. For InP-based materials, the preferred etch is a solution of 1 part water to 10 parts 49% Hydroflouric acid (HF). Re-appearance of oxides after etching can be prevented by performing the assembly shown in FIG. 11 in an oxygen free environment. The preferred oxygen-free environment is a nitrogen ambient inside a glove-box.

Figure 11A:
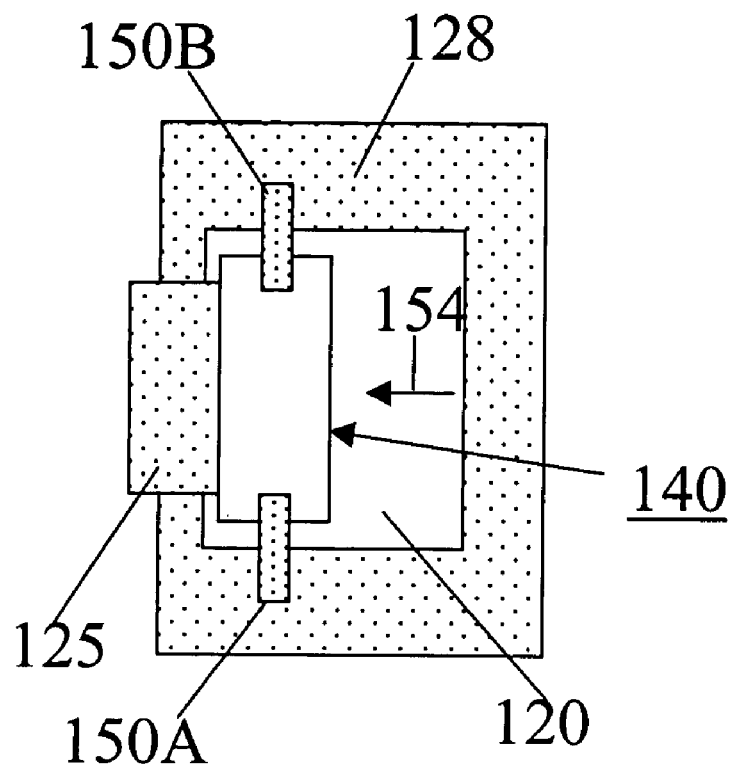
FIG. 11A is a schematic representation of the preferred method of making the present invention, illustrating the first three steps of a flow chart in FIG. 12.
Figure 12:
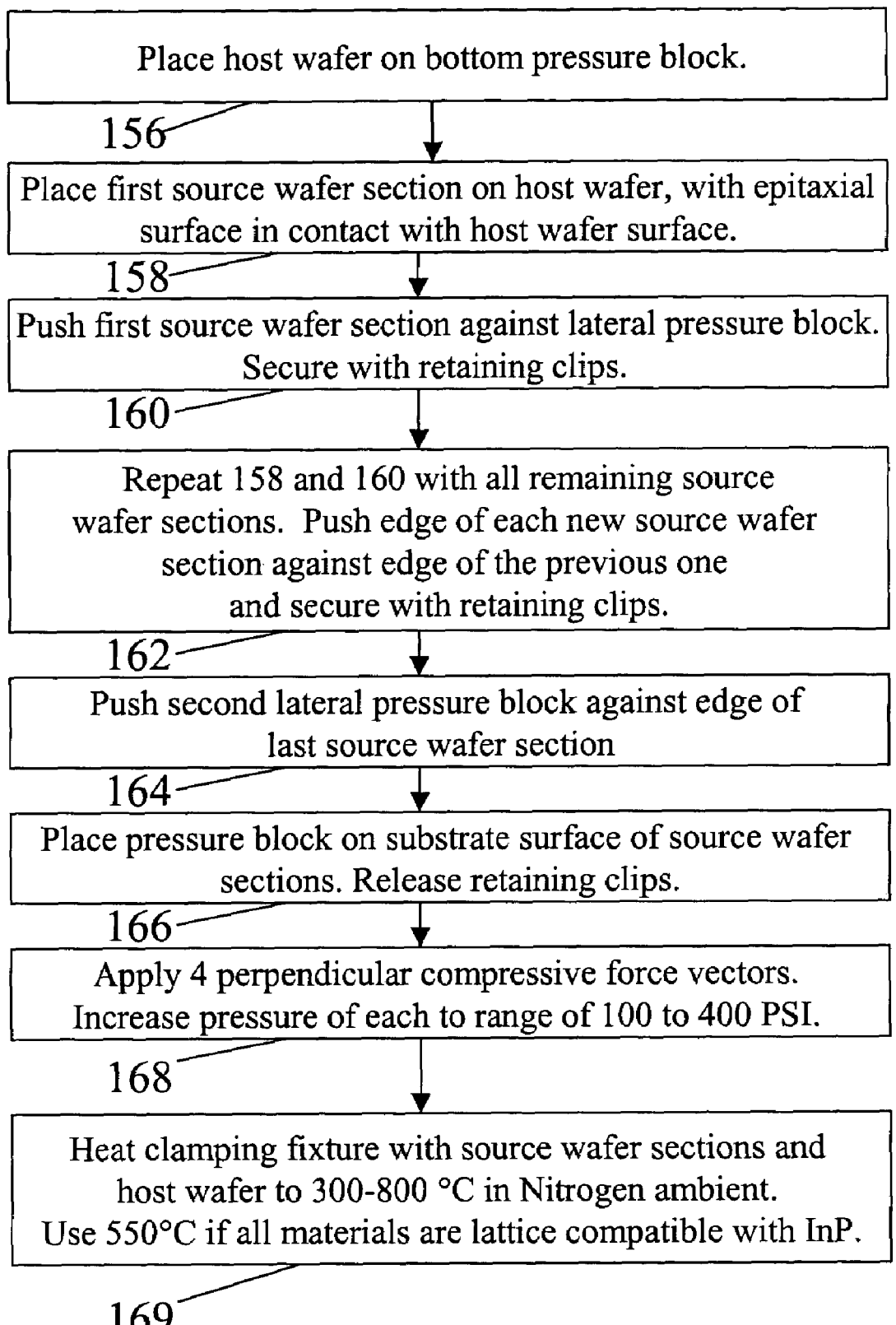
FIG. 12 is a flow chart describing the preferred method of making the present invention.

Beginning in FIG. 11A, the first source wafer section 140 is placed on the host substrate 120 and pushed up against the pressure block 125. A small lateral force in the direction of a vector 154 is employed to ensure the source wafer section 140 is in good contact with the block 125. The host substrate 120 sits on the bottom pressure block 128. After the source wafer section 140 is pressed against the block 125, temporary retaining clips 150A and 150B are clamped on the ends of source wafer section 140 to hold it in place. FIG. 11A corresponds to steps 156, 158, and 160 in FIG. 12.

Figure 11B:
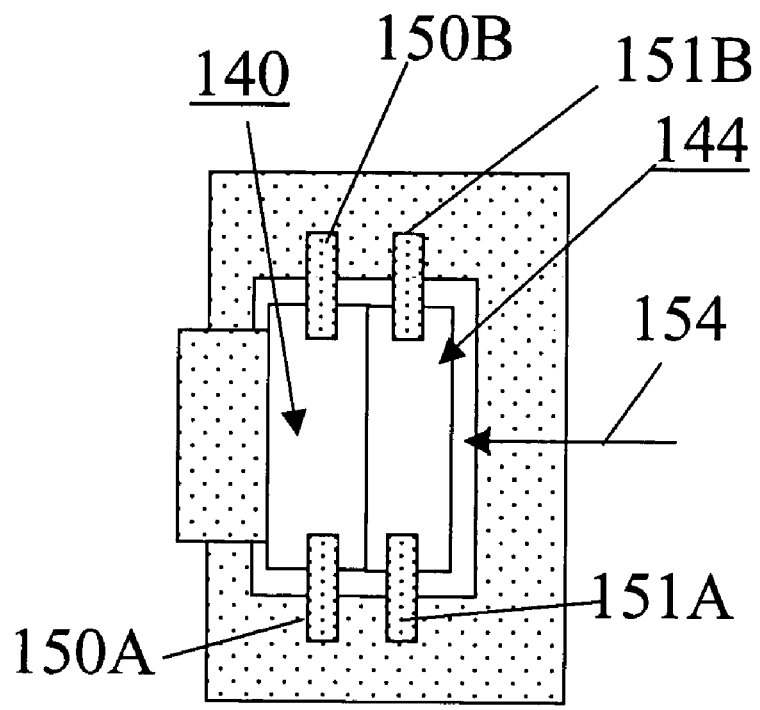
FIG. 11B is a schematic representation of the preferred method of making the present invention, illustrating the fourth step of a flow chart in FIG. 12.
Figure 11C:
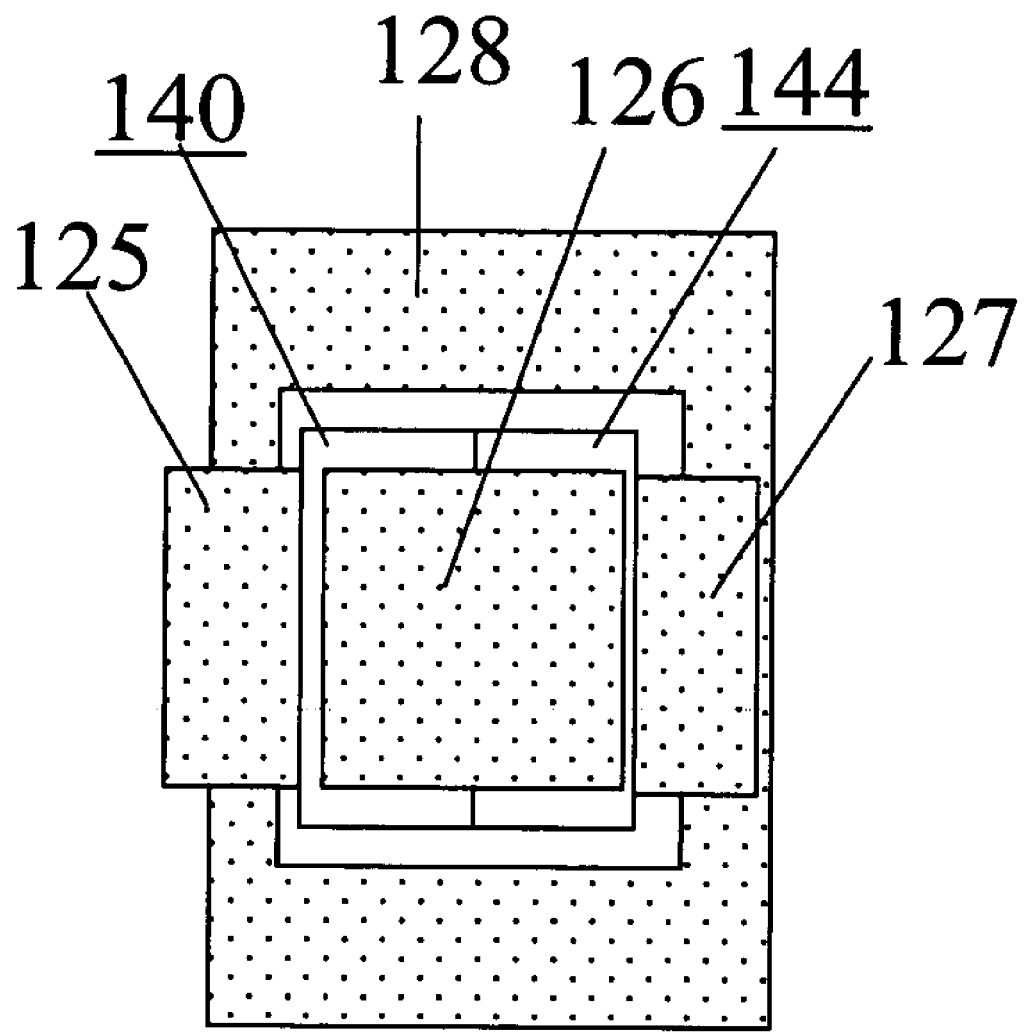
FIG. 11C is a schematic representation of the preferred method of making the present invention, illustrating the fifth and sixth steps of a flow chart in FIG. 12.

FIG. 11B illustrates the process essentially repeated, with the edge of source wafer section 144 pushed against the edge of source wafer section 140. Retaining clips 151A and 151B are applied to hold 144 in place. This corresponds to step 162 in FIG. 12. The pressure block 127 is then pushed against the right lateral edge of the rightmost source wafer section 144, as shown in FIG. 11C (step 164 of FIG. 12.). The vertical pressure block 126 is then placed on top of the sections, and the temporary retaining clips are removed (step 166 in FIG. 12). The force vectors 129–132, shown in FIG. 10 but not in FIG. 11C, are then applied to the assembly. The required room-temperature force is in the range of 100 to 400 pounds per square inch, and can be determined by straightforward empirical means (step 168 of FIG. 12). The entire assembly is then heated to 300–800° C., depending on the materials, as is familiar to those skilled in the art. During heat-up, the source wafer sections are constrained in two dimensions, forcing vertical and lateral bonding. This heat-up is described in step 169 of FIG. 12.

The form of the invention described in FIGS. 7–12 can be applied to numerous opto-electronic or opto-mechanical device structures. FIGS. 12–19 illustrate several exemplary embodiments of opto-electronic devices which can be realized according to the principles of the invention.

Figure 13:
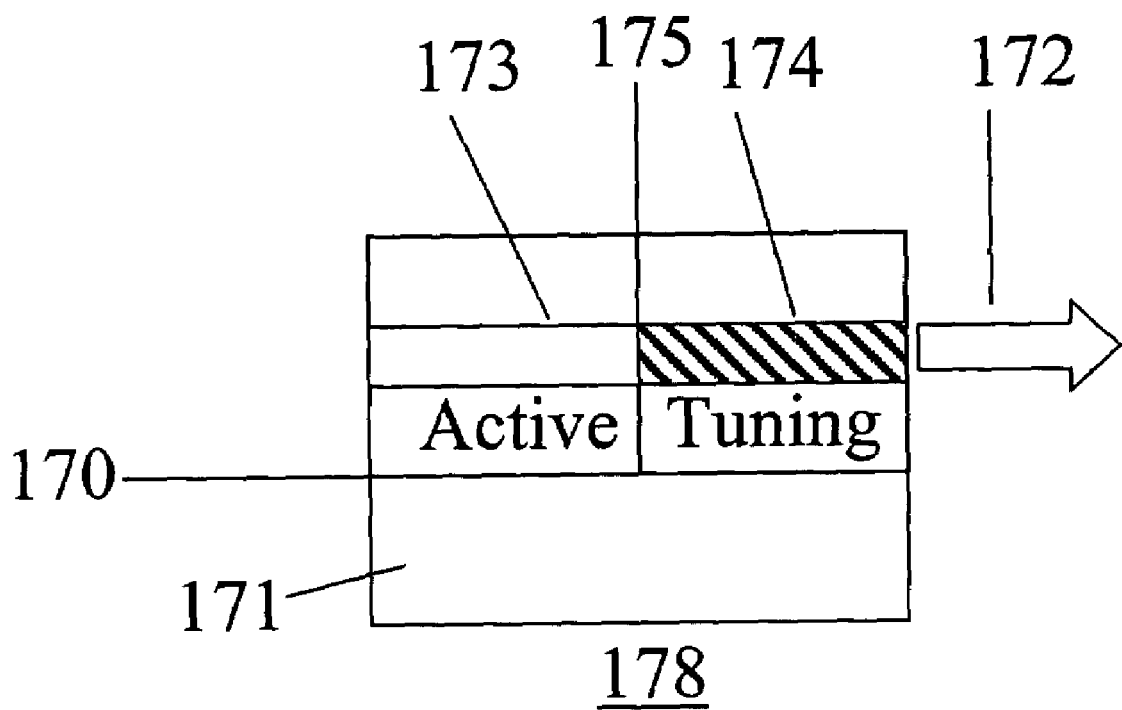
FIG. 13 is a schematic representation of a laser integrated with a passive tuning section in accordance with the present invention.

FIG. 13 illustrates a tunable laser 178 in accordance with the present invention. A preferred embodiment includes an active region 173 integrated with a passive tuning region 174, and separated by a vertical wafer bonded interface 175. The active region and passive tuning region are integrated on a host substrate 171, separated by a horizontal wafer bonded interface 170. This device enables tuning the wavelength of emitted light 172.

Figure 14:
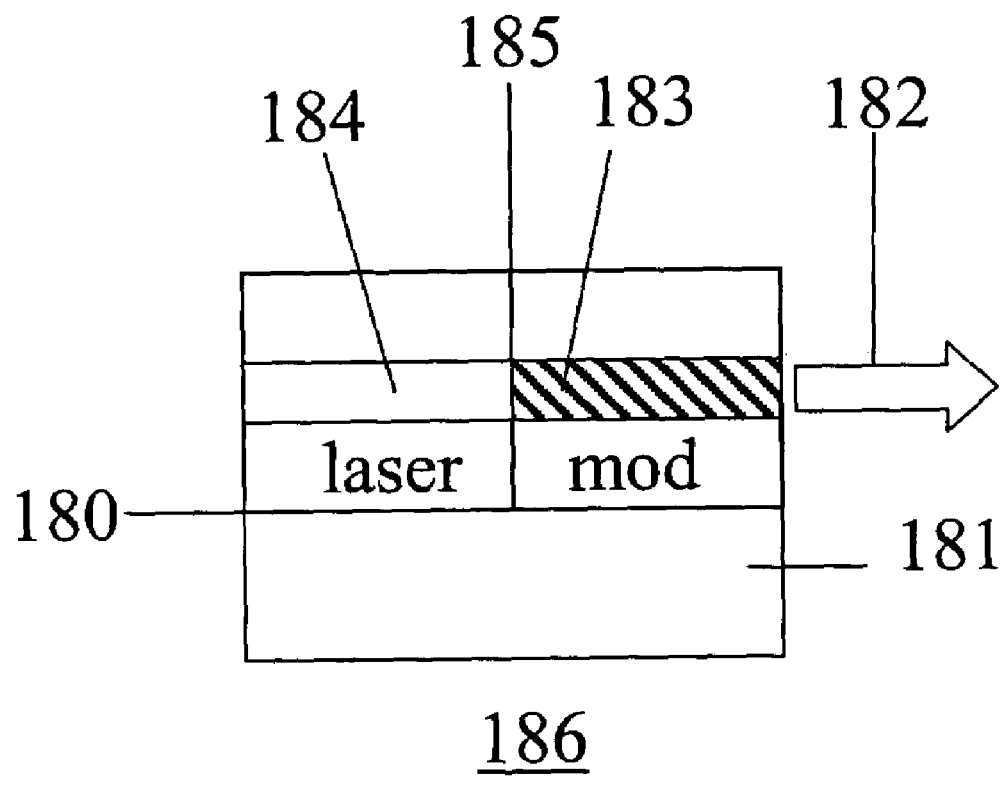
FIG. 14 is schematic representation of a laser integrated with an electro-absorption modulator in accordance with the present invention.

FIG. 14 illustrates a laser modulator pair 186 in accordance with the present invention. A laser region 184 is integrated with an electro-absorption modulator region 183, separated by a vertical wafer bonded interface 185. The modulator modulates the intensity of the emitted light 182, to transmit information in a communication system. The flexibility afforded by the present invention to design the electro-absorption modulator region 183 independently of the laser region 184 promises one or more of lower modulator chirp, capacitance, voltage, and insertion loss, along with higher contrast and higher laser power, as is understood by those familiar with the art. The modulator and laser are bonded to a host substrate 181, creating a horizontal wafer bonded interface 180 in accordance with the present invention.

Figure 15:
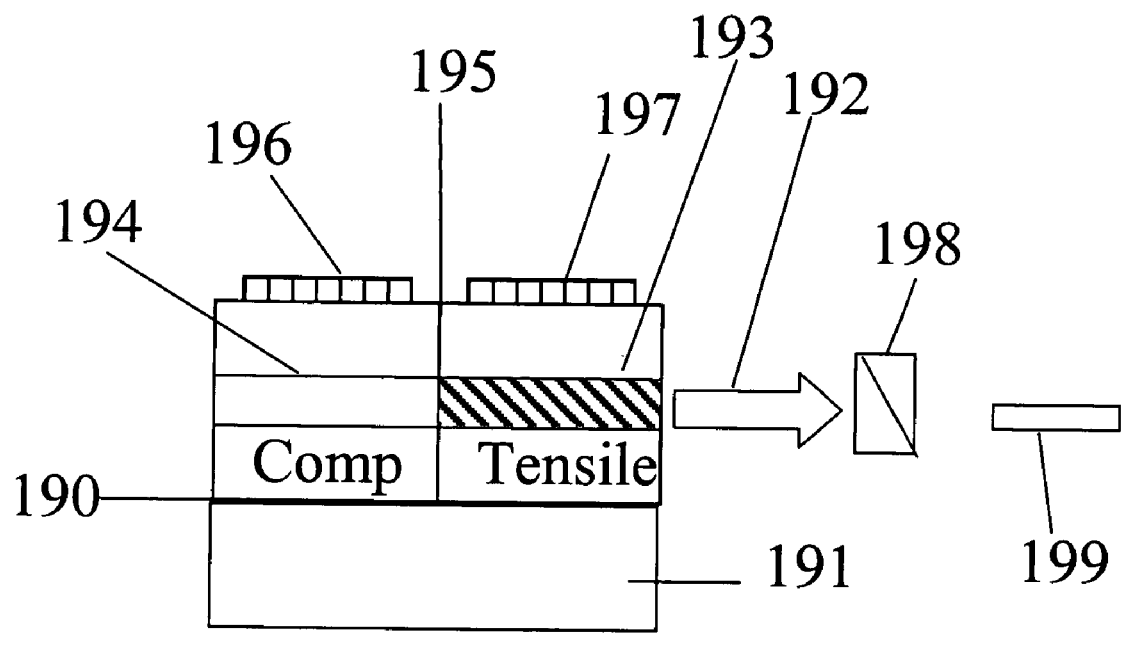
FIG. 15 is a schematic representation of a laser containing a section with compressively strained quantum wells and another section with tensilely strained quantum wells according to the present invention.

FIG. 15 illustrates a polarization switching laser 200 in accordance with the present invention. A preferred embodiment includes an active region 194, comprising compressively strained quantum wells, and designed to provide larger gain for the TE polarization than the TM polarization, butted against an active region 193, comprising tensilely strained quantum wells and designed to provide larger gain for the TM polarization than the TE polarization. A vertical wafer bonded interface 195 separates the two active regions 193 and 194. The active regions 193 and 194 are wafer bonded to a common host substrate 191, creating a horizontal wafer bonded interface 190. Separate electrical contacts 196 and 197 enable separate control of the TE and TM gains, allowing the emitted light 192 to be rapidly switched between the polarizations. A polarizer 198 passes only one polarization to an optical fiber 199, enabling the polarization switching to be converted to on/off modulation in a communication system.

Figure 16:
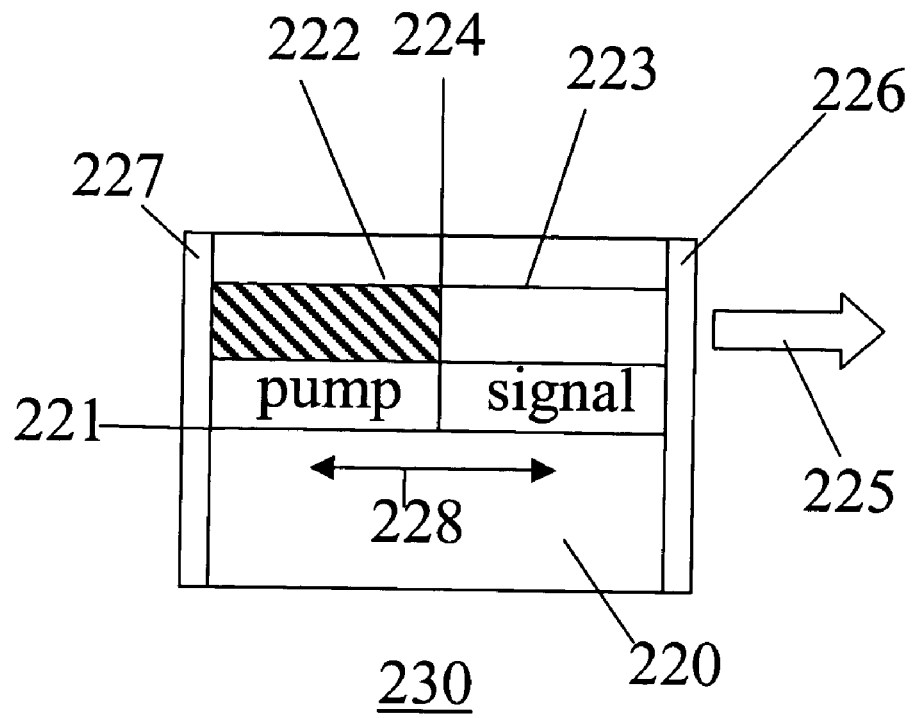
FIG. 16 is a schematic representation of an optically pumped laser, where the pump geometry is axial and the pump is integrated with the signal laser according to the present invention.

FIG. 16 illustrates an end-pumped shared cavity optically pumped laser 230 in accordance with the present invention. A preferred embodiment includes a pump active region 222 integrated with a signal active region 223. The pump active region 222 emits laser radiation at a pump wavelength, which optically pumps the second active region 223, emitting laser radiation at a signal wavelength longer than the pump wavelength. Both pump and signal lasers oscillate parallel to the axis 228. A vertical wafer bonded interface 224 exists between the two active regions. By proper design of the transmission spectrum of optional dielectric first and second dielectric mirrors 226 and 227, emitted laser radiation 225 can consist of only the signal wavelength, and not the pump wavelength. The two active regions are integrated on a host substrate 220, separated by a horizontal wafer bonded interface 221, in accordance with the present invention.

Figure 17:
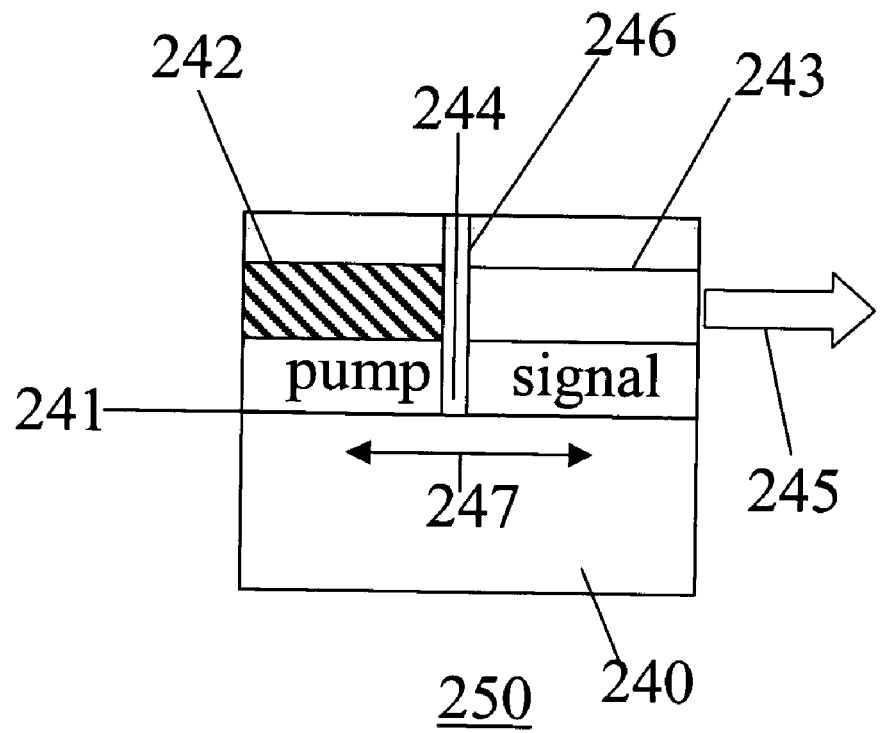
FIG. 17 is a schematic representation of an optically pumped laser where the pump geometry is axial, the pump is integrated with the signal laser according to the present invention, and a dielectric mirror exists at one end of the signal laser.

FIG. 17 illustrates an end-pumped optically pumped laser 250, in which pump and signal do not share the same laser cavity. In a preferred embodiment, a pump active region 242 is integrated with a signal active region 243, separated by a vertical wafer bonded interface 244, according to the present invention. The pump active region 242 emits laser radiation at a pump wavelength, which optically pumps the second active region 243, emitting laser radiation at a signal wavelength longer than the pump wavelength. Both pump laser and signal laser oscillate parallel to an axis 247. In this case, the signal active region 243 has a dielectric mirror coating 246 deposited before the assembly of the structure. The dielectric mirror 246 forms an interfacial layer at the wafer bonded interface 244. The dielectric to semiconductor bond comprised by the bonded interface 244 will not be as strong as a semiconductor to semiconductor bond, such as the one at the interface 224 in FIG. 16, but the presence of the horizontal wafer bond to the host substrate 240 at the horizontal wafer bonded interface 241 creates overall mechanical robustness. In addition, the intimate optical contact afforded by the vertical interface 244 will allow low-loss optical transmission.

Figure 18:
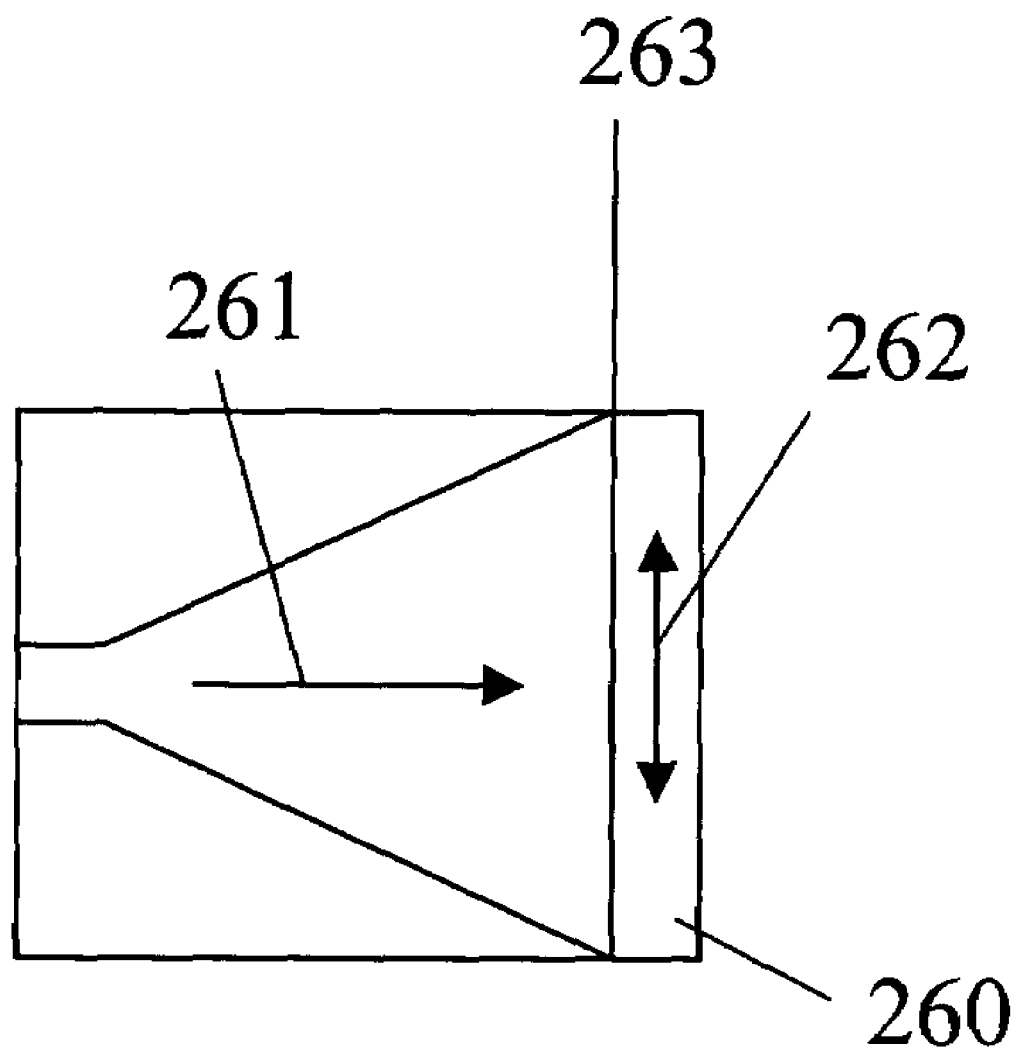
FIG. 18 is a schematic representation of an optically pumped laser where the pump geometry is transverse, and the pump is integrated with the signal laser according to the present invention.

FIG. 18 illustrates a top-view of a side-pumped optically pumped laser 270 according to the present invention. In a preferred embodiment, a tapered waveguide high power pump laser beam 261 pumps a signal laser 260 transverse to its axis of oscillation 262. A vertical wafer bonded interface 263 separates pump and signal lasers. Additionally, both pump and signal sections are wafer bonded to a host substrate along a horizontal wafer bonded interface not shown in FIG. 18.

Figure 19:
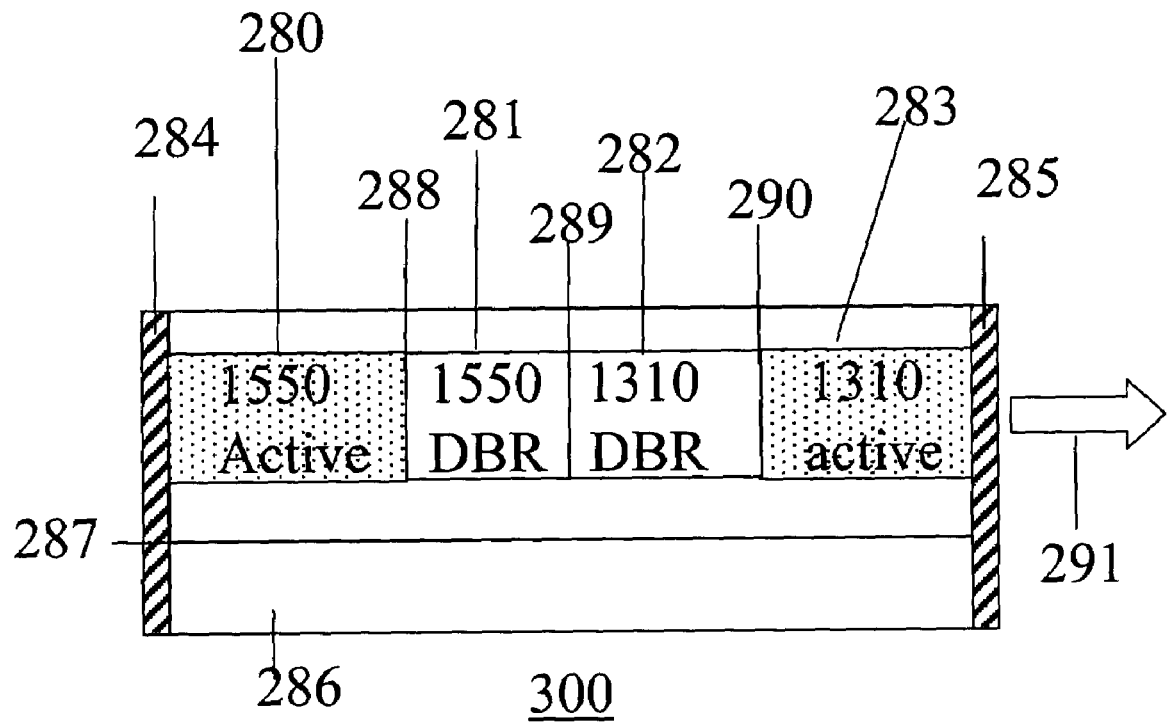
FIG. 19 is a schematic representation of a 1550 nm distributed Bragg reflector (DBR) laser in line with a 1310 nm distributed Bragg reflector laser (DBR) laser, where both wavelengths exit from the same aperture.

FIG. 19 illustrates a 2 wavelength in-line wavelength division multiplexed (WDM) transmission source 300 fabricated according to the present invention. In a preferred embodiment, a 1550 nm active region 280 is separated from a 1550 nm Distributed Bragg Reflector (DBR) 281 by a first wafer bonded interface 288. The 1550 nm DBR 281 is joined laterally to a 1310 DBR 282 at a second vertical wafer bonded interface 289. The 1310 DBR 282 is connected to a 1310 active region 283 at a third vertical wafer bonded interface 290. The regions 280, 281, 282, and 283 are joined to a host substrate 286 at a horizontal wafer bonded interface 287. A first dielectric mirror 284 and a second dielectric mirror 285 ensure that the emitted beam 291, which comprises both 1550 nm radiation and 1310 nm radiation, is emitted from the proper side of the device.

Figure 20:
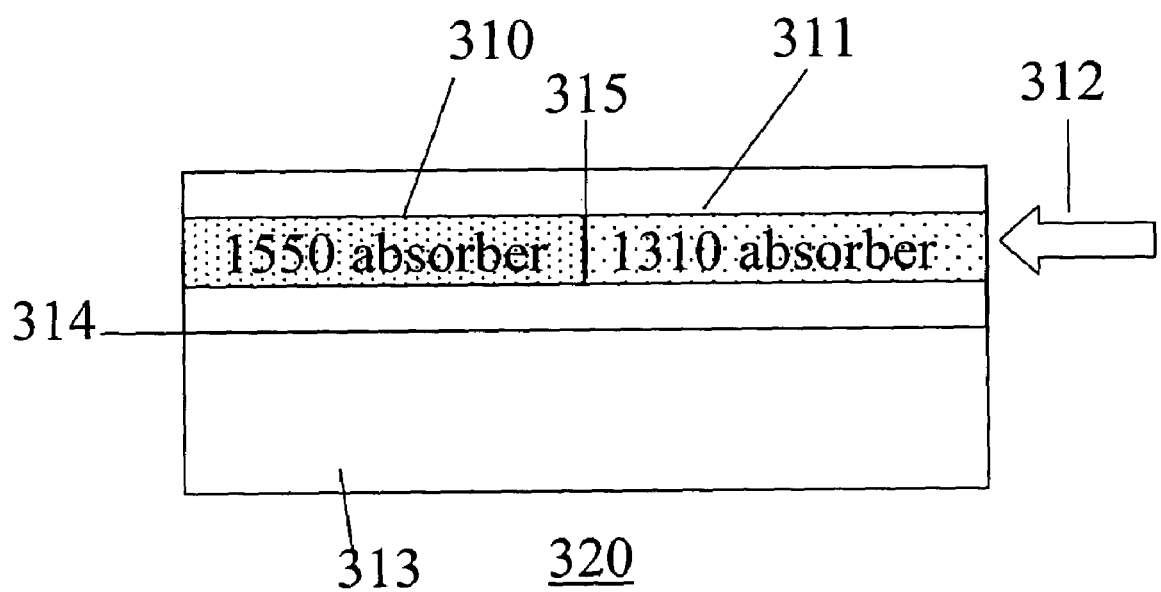
FIG. 20 is a schematic representation of a 1310 nm detector in line with a 1550 nm detector, where both wavelengths enter at the same aperture.

FIG. 20 illustrates an in-line 2-wavelength WDM receiver 320 according the present invention. In a preferred embodiment, a 1550 nm absorber region 310 is butted against a 1310 nm absorber region 311, at a vertical wafer bonded interface 315. Both regions are bonded to a host substrate 313, at a horizontal wafer bonded interface 314. Incoming radiation 312 is comprised of both 1550 nm radiation and 1310 nm radiation. The 1310 nm portion of the incoming radiation 312 is absorbed in the section 311, while the 1550 nm portion of 312 passes through the 1310 nm absorber and is absorbed in the 1550 nm absorber 310.

While this invention has been particularly shown and described with references to preferred embodiments thereof, it will be understood by those skilled in the art that various changes in form and details may be made therein without departing from the spirit and scope of the invention as defined by the appended claims.

What is claimed is:

1. A structure comprising:
   a substrate having a planar surface,
   a first epitaxial region having an edge surface defined by a cleaved facet and a planar surface disposed substantially perpendicularly to said edge surface,
   a second epitaxial region having an edge surface defined by a cleaved facet and a planar surface disposed substantially perpendicularly to said edge surface,
   means for bonding the planar surfaces of the first and second epitaxial regions to the planar surface of the substrate, and
   means for bonding the edge surface of the first epitaxial region to the edge surface of the second epitaxial region.

2. The structure of claim 1, wherein said means for bonding the edge surface of the first epitaxial region to the edge surface of the second epitaxial region is a direct semiconductor to semiconductor bond.

3. The structure of claim 1, wherein said means for bonding the edge surface of the first epitaxial region to the edge surface of the second epitaxial region includes an interfacial layer.

4. The structure of claim 3, wherein said interfacial layer comprises at least one material selected from the group consisting of silicon dioxide, titanium dioxide, cadmium fluoride, Hafnium Dioxide, Magnesium Flouride, Gold, and silver.

5. The structure of claim 1, wherein said means for bonding the planar surfaces of the first and second epitaxial regions to the planar surface of the substrate is a direct semiconductor to semiconductor bond.

6. The structure of claim 1, wherein said means for bonding the planar surfaces of the first and second epitaxial regions to the planar surface of the substrate includes an interfacial layer.

7. The structure of claim 6, wherein said interfacial layer is an epoxy.

8. The structure of claim 6, wherein said interfacial layer is gold.

9. The structure of claim 1, wherein one of the first and second epitaxial regions includes at least one quantum well having compressive strain.

10. The structure of claim 1, wherein one of the first and second epitaxial regions includes at least one quantum well having tensile strain.

11. The structure of claim 1, wherein one of the first and second epitaxial regions includes an optically active material, and wherein the other of the first and second epitaxial regions includes an optically passive material.

12. The structure of claim 11, further comprising means for changing a refractive index of the optically passive region, thereby causing said optically passive material to tune a wavelength of radiation emitted by said optically active material.

13. The structure of claim 1, wherein one of first and second epitaxial regions is a laser active region and wherein the other of the first and second epitaxial regions is a modulator region.

14. The structure of claim 13, wherein said modulator region is an electro-absorption modulator region.

15. The structure of claim 1, wherein one of the first and second epitaxial regions contains epitaxy for making a pump laser at a first wavelength, and wherein the other of the first and second epitaxial regions contains epitaxy for making a signal laser at a second wavelength.

16. The structure of claim 15, wherein said pump laser and said signal laser oscillate along a common axis.

17. The structure of claim 15, wherein said pump laser emits radiation along an axis perpendicular to an axis defining the path of radiation emitted by said signal laser.

18. A semiconductor laser system comprising:
   a substrate having a first planar surface
   a first epitaxial region having an edge surface and a planar surface disposed substantially perpendicularly to said edge surface;
   a second epitaxial region having an edge surface and a planar surface disposed substantially perpendicularly to said edge surface;
   means for bonding the planar surfaces of the first and second epitaxial regions to the planar surface of the substrate, wherein one of the first and second epitaxial regions comprises compressively strained quantum wells operative to provide gain for a substantially TE mode, and the other of said first and second epitaxial regions comprises tensilely strained quantum wells operative to provide gain for a substantially TM mode; and means for bonding the edge surface of the first epitaxial region to the edge surface of the second epitaxial region.

19. The semiconductor laser system of claim 18, further comprising a first means for providing a flow of electrons and holes to the compressively strained quantum well and a second means for providing a flow of electrons and holes to the tensilely strained quantum well.

20. The semiconductor laser system of claim 19, further comprising a means for independent control of the first means for providing a flow of electrons and holes to the compressively strained quantum well and the second means for providing a flow of electrons and holes to the tensilely strained quantum well.

21. The semiconductor laser system of claim 20, further comprising emitted radiation and a polarizer in the path of said emitted radiation.

22. The semiconductor laser system of claim 21, further comprising an optical fiber to receive radiation emitted through the polarizer.

* * * * *